US011328750B1

(12) United States Patent
Amirante et al.

(10) Patent No.: US 11,328,750 B1
(45) Date of Patent: May 10, 2022

(54) BITCELL ARCHITECTURE WITH BURIED GROUND RAIL

(71) Applicant: Arm Limited, Cambridge (GB)

(72) Inventors: Ettore Amirante, Nice (FR); Andy Wangkun Chen, Austin, TX (US); Yew Keong Chong, Austin, TX (US); Sony, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/155,400

(22) Filed: Jan. 22, 2021

(51) Int. Cl.
*G11C 5/14* (2006.01)
*H01L 23/528* (2006.01)
*H01L 27/02* (2006.01)
*G11C 17/12* (2006.01)

(52) U.S. Cl.
CPC ............... *G11C 5/14* (2013.01); *G11C 17/12* (2013.01); *H01L 23/5286* (2013.01); *H01L 27/0207* (2013.01)

(58) Field of Classification Search
None
See application file for complete search history.

(56) References Cited

U.S. PATENT DOCUMENTS

| | | | | |
|---|---|---|---|---|
| 5,790,447 A | * | 8/1998 | Laudon | G11C 5/00 365/52 |
| 2007/0047354 A1 | * | 3/2007 | Nishio | G11C 5/147 365/206 |
| 2011/0204917 A1 | * | 8/2011 | O'Neill | H01L 23/481 326/38 |
| 2014/0071755 A1 | * | 3/2014 | Karamcheti | G11C 16/06 365/185.05 |

* cited by examiner

*Primary Examiner* — Tan T. Nguyen
(74) *Attorney, Agent, or Firm* — Pramudji Law Group PLLC; Ari Pramudji

(57) ABSTRACT

Various implementations described herein are related to a device with a backside power network. The backside power network may have a buried power rail that is coupled to ground. The device may have a read-only memory (ROM) cell that is coupled between at least one bitline and the buried power rail, and the ROM cell may be coupled to ground by way of the buried power rail.

20 Claims, 8 Drawing Sheets

US 11,328,750 B1

BITCELL ARCHITECTURE WITH BURIED GROUND RAIL

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern bitcell architecture, conventional read-only memory (ROM) typically uses frontside programming layers to write to memory. Once written, ROM bitcells cannot be rewritten unless all programming layers are re-programmed. For cost efficiency, ROM bitcells typically use fewer programming layers; however, with fewer programming layers, conventional ROM designs tend to not inefficient in power, performance and area (PPA), wherein area and critical signal lines (e.g., VSS/WL/BL) are important metrics for efficient ROM bitcell designs. As such, there exists a need to improve traditional design and layout techniques that allow for efficient ROM bitcell fabrication.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to bitcell fabrication schemes and techniques for read-only memory applications in various physical layout designs. For instance, the various schemes and techniques described herein may provide for various read-only memory (ROM) bitcell architectures using complementary field-effect transistor (FET) technology. As such, various bitcell fabrication schemes and techniques described herein provide for a novel architecture in physical layout design of bitcell architecture of single-transistor (e.g., 1T) ROM bitcells in FET based memory technology having buried metallization for coupling ROM bitcell structures to ground (VSS or GND). Therefore, in some instances, the various bitcell fabrication schemes and techniques described herein provide for novel ROM bitcells with buried metal coupled to ground (VSS or GND).

Also, to overcome the deficiencies of conventional ROM bitcell designs, various bitcell fabrication schemes and techniques described herein provide for a novel ROM cell architecture that improves performance in reference to less resistor-capacitor (RC) issues for bitlines (BL) and wordlines (WL). Further, other advantages of the present disclosure provide for improving power by reducing bitline capacitance. Moreover, other advantages of the present disclosure provide for reducing area by enabling 1CPP (one critical poly pitch) wide ROM bitcell architectures for future nodes in memory applications.

Various implementations of providing fabrication schemes and techniques for memory applications will be described herein with reference to FIGS. 1A-6.

Figure 1A:
FIG. 1A illustrates a diagram of buried power rail architecture in accordance with various implementations described herein.

FIG. 1A illustrates a diagram 100A of buried power rail (BPR) architecture 104A in accordance with various implementations described herein.

In various implementations, the BPR architecture 104A may be implemented as a system or device having various integrated circuit (IC) components that are arranged and coupled together as an assemblage or combination of parts that provide for a physical circuit design and related structures. In some instances, a method of designing, providing, building and/or fabricating the BPR architecture 104A as an integrated system or device may involve use of various IC circuit components described herein to thereby implement various backside power distribution schemes and techniques associated therewith. Also, the BPR architecture 104A may be integrated with various computing circuitry and related components on a single chip, and the BPR architecture 104A may also be implemented in various embedded systems for automotive, electronic, mobile, server and Internet-of-things (IoT) applications, including remote sensor nodes.

As shown in FIG. 1A, the BPR architecture 104A may have a frontside power network (FSPN) 108 along with frontside power rails (FPR) that are coupled to various components and/or logic circuits. In some instances, the frontside power rails (FPR) may be coupled to logic circuitry associated with read-only memory (ROM) cells and/or bitcells including an array of ROM cell and/or bitcells arranged in columns and rows. Further, the frontside power network (FSPN) 108 may include a number (N) of frontside metal layers (e.g., M0, M1, M2, . . . , MN) along with one or more inter-layer vias (IV).

The BPR architecture 104A may include a backside power network (BSPN) 118 that provides power distribution for memory components, logic and/or circuitry, such as, e.g., ROM cells and/or bitcells and an array of ROM cells and/or bitcells. The backside power network (BSPN) 118 may include backside power rails (BPR) that are configured to provide power in one or more voltage domains for control logic disposed frontside. The BSPN 118 along with the BPR may be configured to provide one or more of core voltages, periphery voltages and/or ground (VSS or GND).

In some implementations, the backside power network (BSPN) 118 may include backside metal layers (e.g., BM0). For instance, the backside power network (BSPN) 118 may use backside metal layers for backside power rails (BPR). In some instances, one or more backside power rails may be coupled to ground (VSS or GND) for application to memory cells, including, e.g., ROM cell logic disposed frontside. The backside power network (BSPN) 118 may use the backside metal layers (e.g., BM0, BM1, BM2, . . . , BMN) along with the one or more inter-layer vias (IV).

The BPR architecture 104A may have a transistor deposition region (TDR) 114 with one or more transistors, such as e.g., N-type field-effect transistors (NFET) formed on diffusion regions (DR), that may be coupled to a backside metal layer (BM0) by way of inter-layer vias (IV). The buried inter-layer vias (IV) may be configured to provide a power transition between the backside power network (BSPN) and the TDR 114. Thus, the BPR architecture 104A may be configured to transition the backside power rails (BPR) of the BSPN 118 to transistors (NFET) in the TDR 114 so as to thereby provide ground taps to the ROM cells from the backside power network (BSPN). In some instances, buried inter-layer vias (IV) may be used to transition a ground connection from one or more backside power rails (BPR) to the memory circuitry, including, e.g., the ROM bitcell logic disposed frontside. Further, the transistor deposition region (TDR) 114 may also be referred to as buried transition architecture that may have backside-to-frontside transition cells with the buried inter-layer vias (IV) that provide a coupling transition between the backside power network (BSPN) 118 and transistors (NFET) in the TDR 114.

In various implementations, the buried power rail (BPR) architecture 104A may refer to a novel cell architecture that provides buried metal for critical signal nets in some memory applications, such as, e.g., read-only memory (ROM) applications. For instance, the novel cell architecture is configured to provide backside power distribution for memory circuitry (e.g., ROM), wherein metallization is provided backside below memory circuitry as buried power rails coupled to ground (VSS or GND). The novel cell architecture also uses buried metallization for backside-to-frontside transition cells that allows for backside distribution of power and ground nets to memory circuitry disposed frontside. Also, the backside power rails for memory may be buried in the substrate and related oxide layers, and these buried metal lines may be used as ground rails for distributing power net lines coupled to ground (VSS or GND). These aspects and various other features, behaviors and characteristics are described herein in reference to FIGS. 1B-6.

Figure 1B:
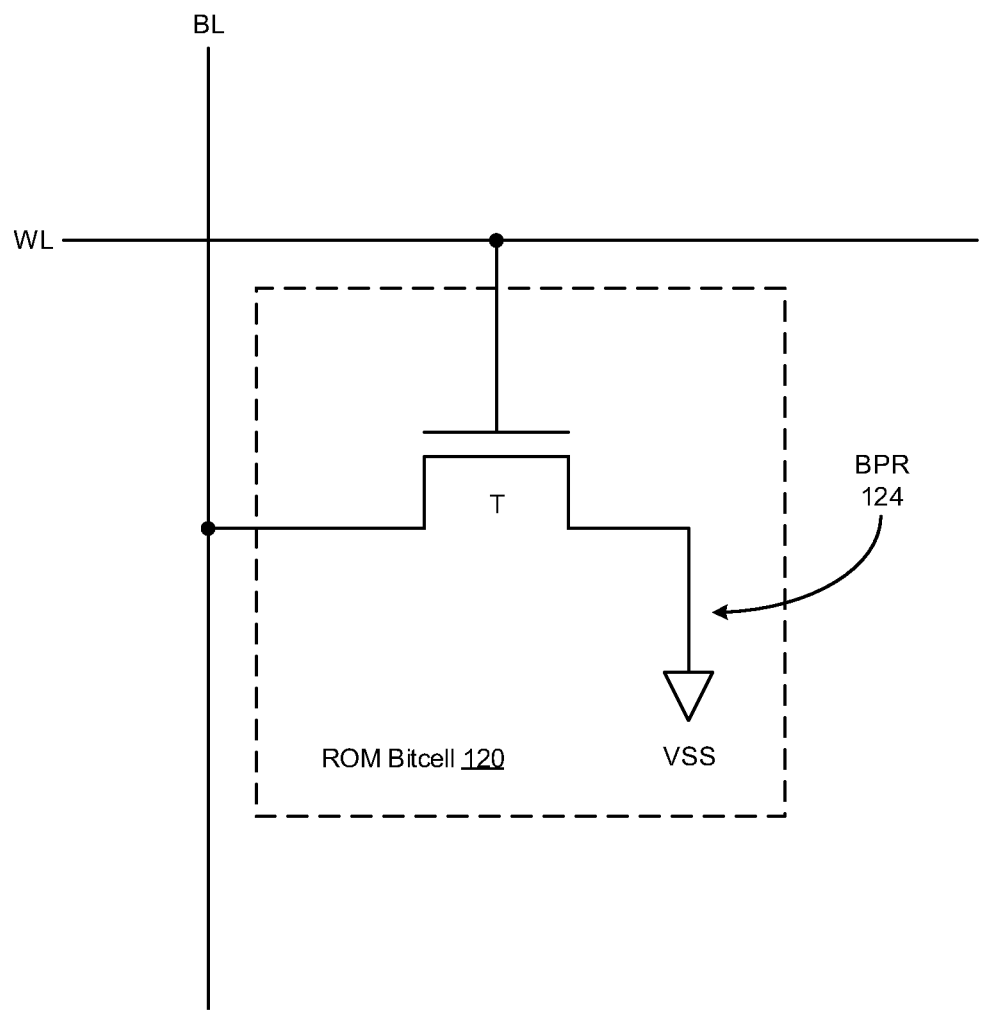
FIG. 1B illustrates a diagram of bitcell architecture in accordance with various implementations described herein.

FIG. 1B illustrates a schematic diagram of bitcell architecture 104B having a buried ground rail 124 in accordance with various implementations described herein.

In some implementations, the bitcell architecture 104B may be implemented as a system or a device having various integrated circuit (IC) components that are arranged and coupled together as an assemblage or combination of parts that provide for physical circuit designs and various related structures. In some instances, a method of designing, providing and building the bitcell architecture 104B as an integrated system or device may involve use of various IC circuit components described herein so as to thereby implement fabrication schemes and techniques associated therewith. Also, the bitcell architecture 104B may be integrated with computing circuitry and related components on a single chip, and the bitcell architecture 104B may be implemented in various embedded systems for automotive, electronic, mobile, server and Internet-of-things (IoT) applications.

As shown in FIG. 1B, the bitcell architecture 104B may be implemented with a non-volatile memory (NVM) bitcell structure 120, such as, e.g., a single-transistor bitcell structure for read-only memory (ROM) applications. In some implementations, the single-transistor bitcell structure 120 may be configured as a single ROM bitcell structure having an N-type field-effect transistor (NFET) structure. In some implementations, the ROM cell may have a transistor (T) coupled between a bitline (BL) and ground (VSS or GND), and the transistor (T) may have a gate coupled to a wordline (WL).

The bitcell architecture 104B may be implemented in a ROM based core array having one or more ROM cells or ROM bitcells, wherein each ROM cell may be configured to store at least one data-bit value (e.g., data value related to a logical '0' or '1'). Also, the ROM based core array may include any number of ROM cells or ROM bitcells arranged in various configurations, such as, e.g., a two-dimensional (2D) ROM bitcell array having any number of columns and any number of rows of multiple ROM bitcells, which may be arranged in a 2D grid pattern for read and write memory access. However, even though a ROM bitcell structure is shown and described in FIG. 1B, any other type of NVM bitcell structure may be used to achieve similar results of various bitcell fabrication techniques disclosed herein. Thus, in various instances, each ROM bitcell may be implemented with any other type of NVM memory, including, e.g., magneto-resistive RAM (MRAM) and/or any other type of useable and/or applicable NVM memory. Also, in some instances, each ROM bitcell may refer to a multi-layer MRAM bitcell having a pinned layer (PL) and a free layer (FL), and for data access, each MRAM bitcell may include a wordline (WL), and in MRAM, the bitlines may refer to a bitline (BL) and a source line (SL).

In some implementations, the buried power rail (BPR) architecture may provide a device having a backside power network (BSPN) with a buried power rail (BPR) coupled to ground (VSS or GND). The buried power rail (BPR) architecture may also provide for a read-only memory (ROM) cell that is coupled between at least one bitline (BL) and the buried power rail (BPR), and also, the ROM cell may be coupled to ground (VSS or GND) by way of the buried power rail (BPR). The ROM cell may have a transistor that is coupled between the bitline and the buried power rail, and in some instances, the transistor refers to an N-type field effect transistor (NFET). Also, a gate of the transistor may be coupled to a wordline (WL). In some instances, as described herein below in reference to FIGS. 2-4, the ROM cell has physical dimensions associated with a width of one critical poly pitch (1 CPP) and a height of one standard (STD) cell row, and the ROM cell may be configured with multiple programming layers including dual programming layers. In other instances, as described herein below in reference to FIGS. 5A-5B, the ROM cell has physical dimensions associated with a width of one and a half critical poly pitch (1.5 CPP) and a height of one standard (STD) cell row, and the ROM cell may be configured with a single programming layer. Also, in some instances, a frontside power network may include non-buried power rails, and the bitline may be formed with at least one non-buried power rail of the non-buried power rails having a wide bitline track. Further, in some other instances, the bitline may be formed with at least one non-buried power rail of the non-buried power rails having a narrow bitline track.

Figure 2:
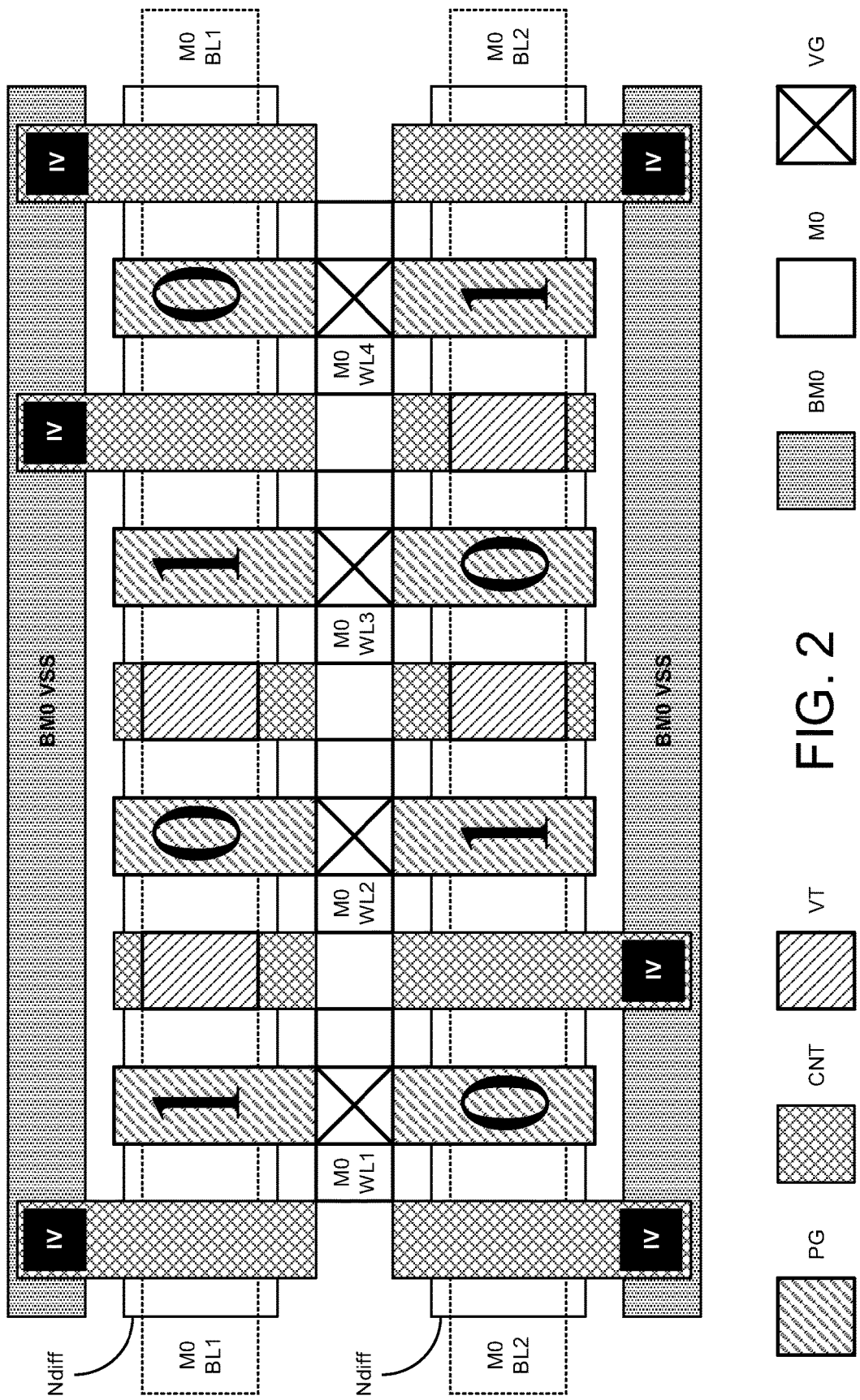
FIGS. 2-4 illustrate diagrams of bitcell architecture with buried power rail in accordance with various implementations described herein.
Figure 3:
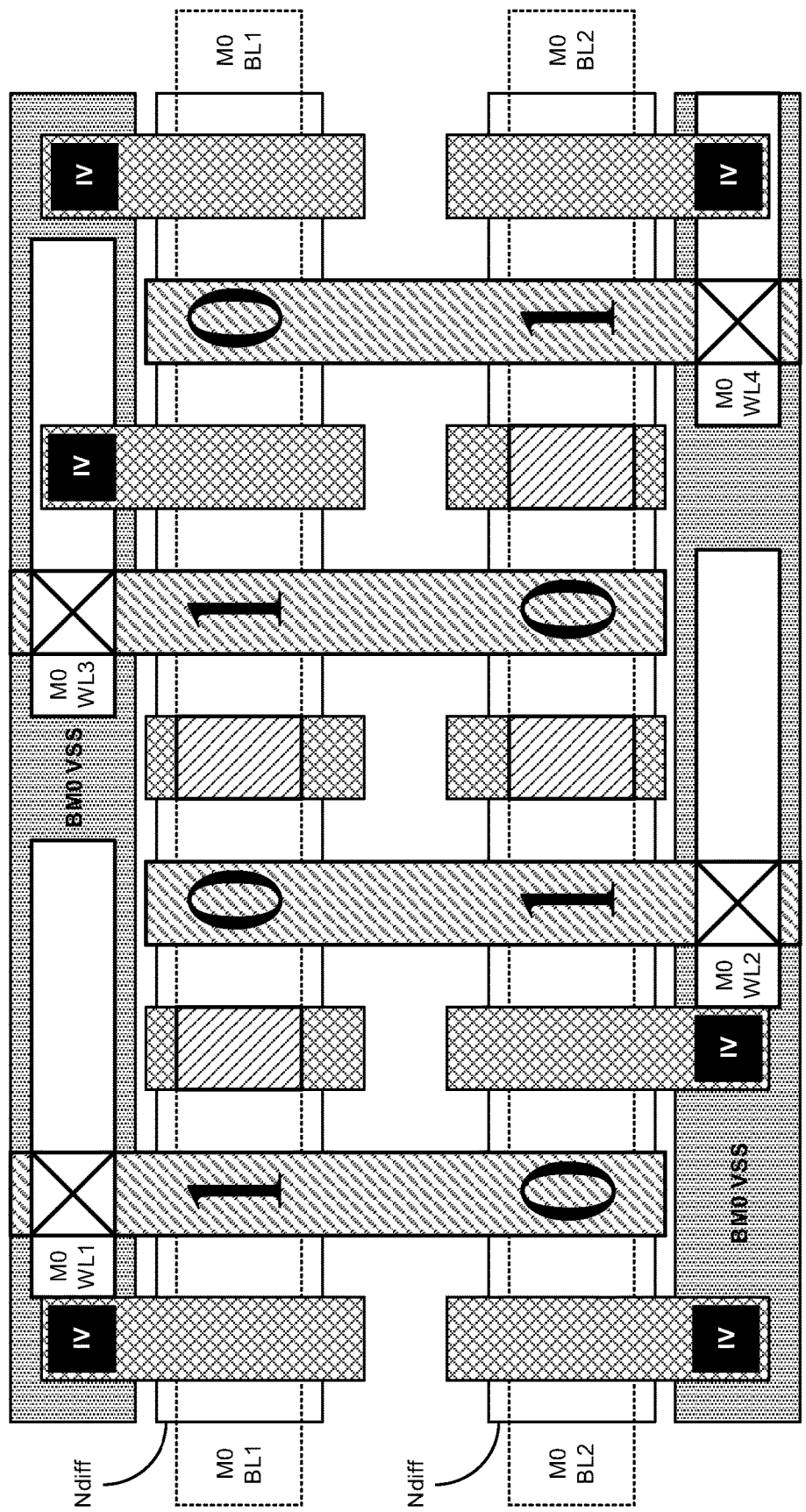
Figure 4:
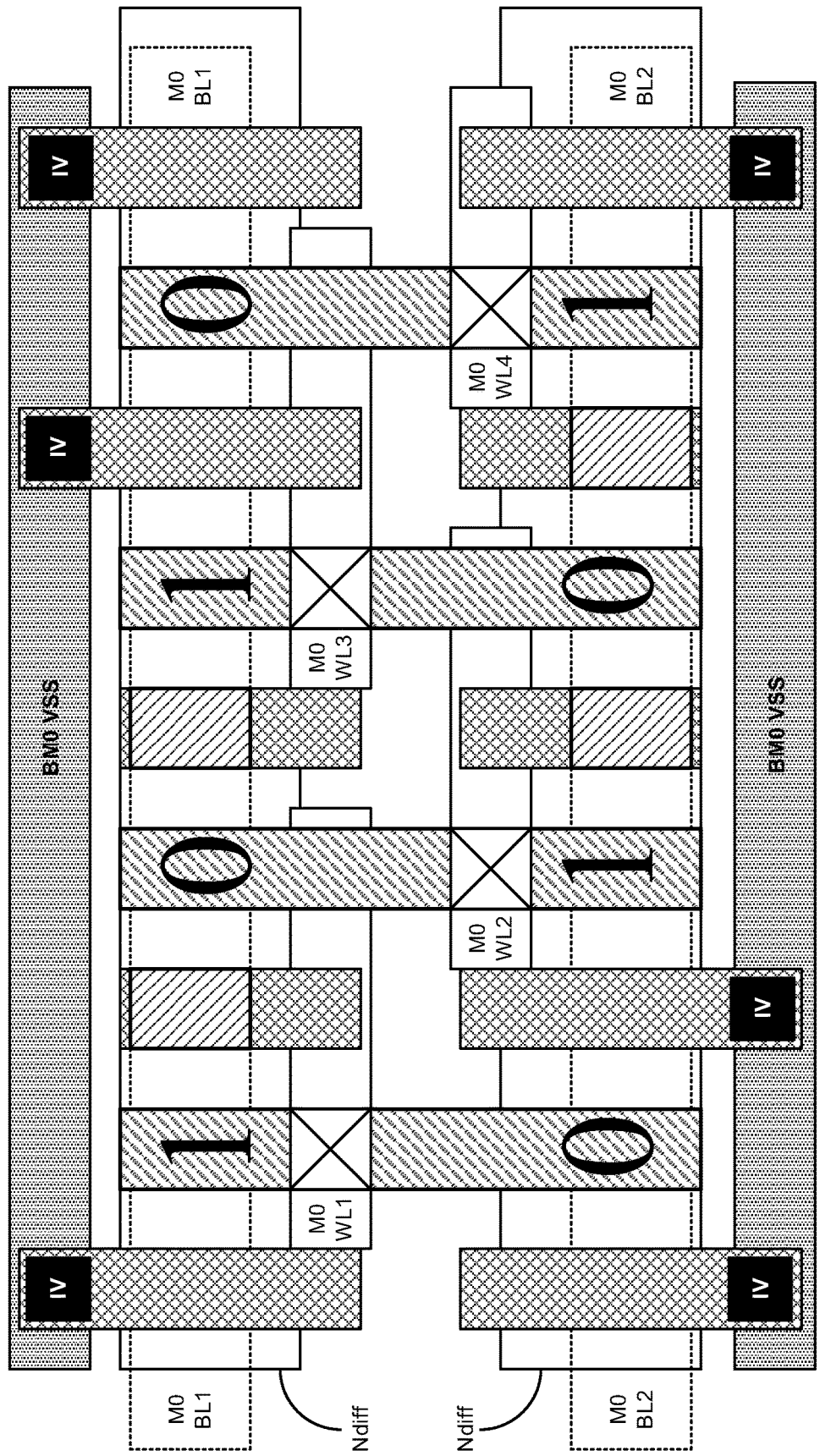
Figure 5A:
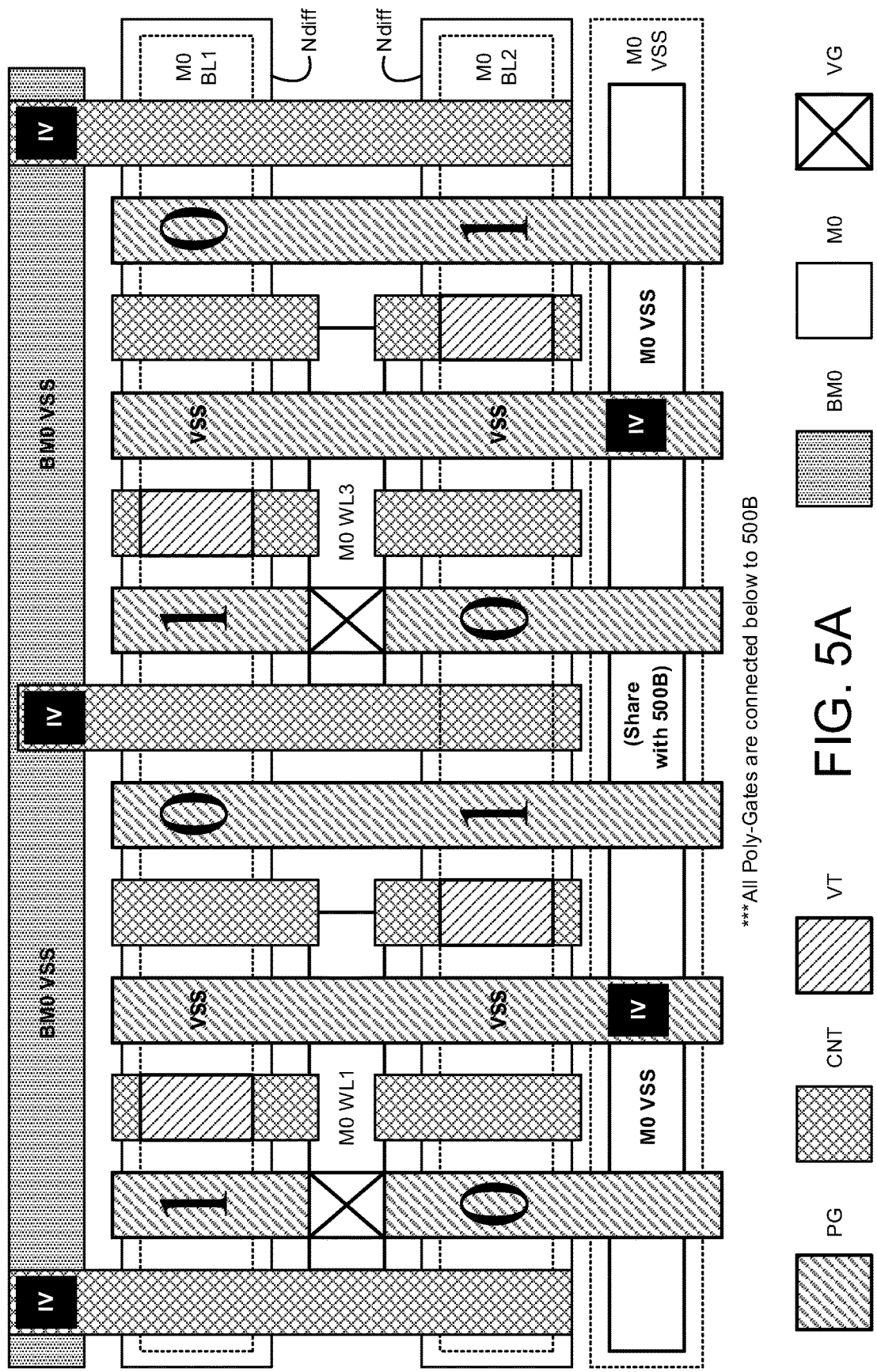
FIGS. 5A-5B illustrate additional diagrams of bitcell architecture with buried power rail in accordance with various implementations described herein.
Figure 5B:
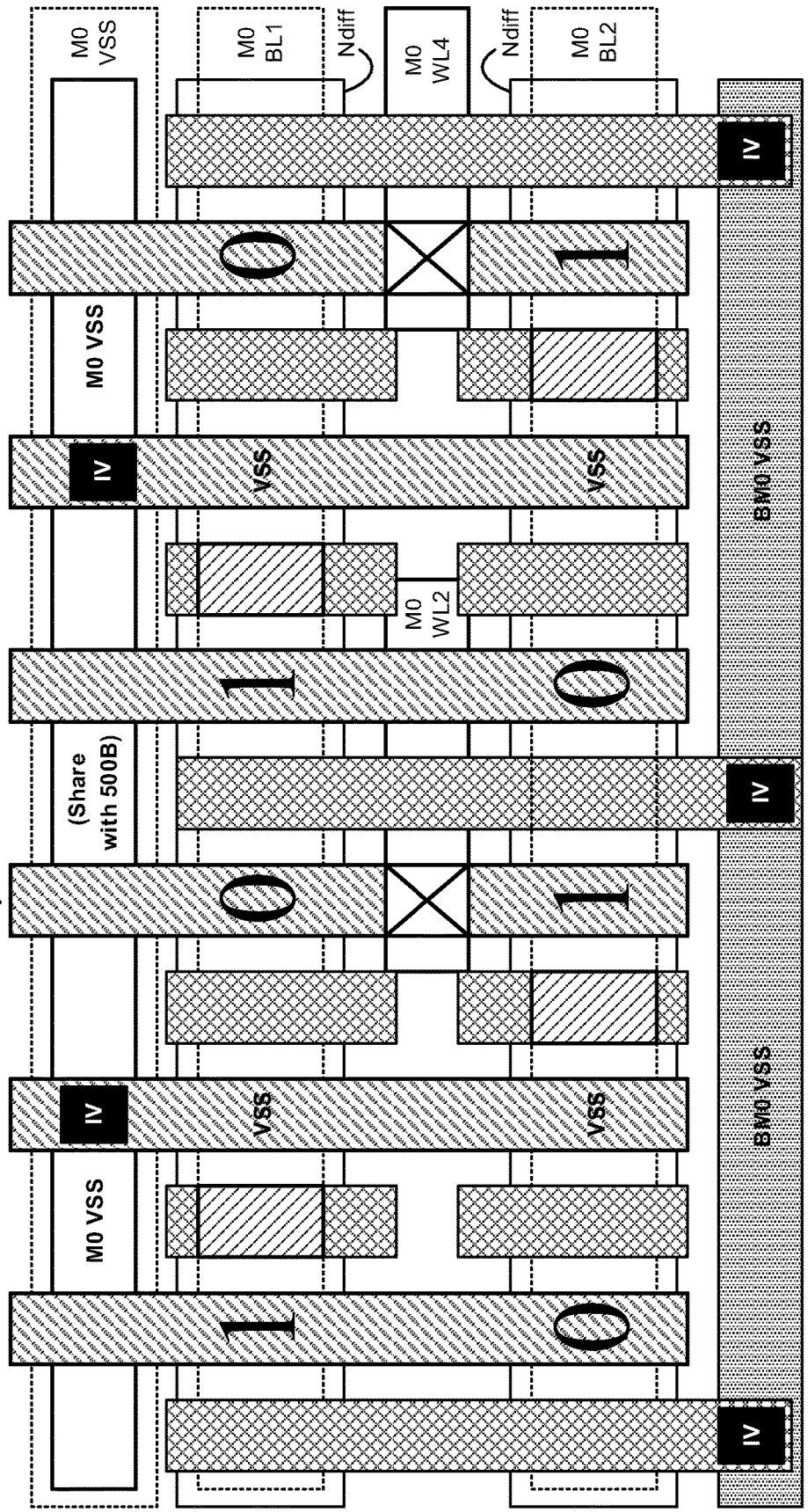

FIGS. 2-5B illustrate various diagrams of buried power rail (BPR) architecture having one or more buried ground rails (BM0 VSS) in accordance with implementations described herein. In particular, FIG. 2 shows a diagram 200 of BPR architecture 204, FIG. 3 shows a diagram 300 of BPR architecture 304, FIG. 4 shows a diagram 400 of BPR architecture 404, and FIGS. 5A-5B show top-half/bottom-half diagrams 500A, 500B of BPR architecture 504A, 504B.

As shown in FIG. 2, the BPR architecture 204 may have backside metal layer (BM0) coupled to ground (VSS or GND), and the BPR architecture 204 may have frontside metal layer (M0) coupled to multiple bitlines (BL1, BL2) and also multiple wordlines (WL1, WL2, WL3, WL4). Also, the BPR architecture 204 may have poly-gate lines (PG)

along with programmable contact (CNT) layers coupled to BM0 with inter-layers vias (IV). Also, the BPR architecture 204 may have one or more programming layers, such as, e.g., the CNT layer and VT layer. In some instances, the CNT layer may be programmed so as to be coupled to ground (BM0 VSS) and a first bitline (M0 BL1) or a second bitline (M0 BL2) by way of the VT layer, and the VT layer may be programmed so as to be coupled to the first bitline (M0 BL1) or the second bitline (M0 BL2). Therefore, the ROM based transistors may be programmed to a logical 1 or a logical 0 depending on the programmed state of the CNT layer and the VT layer.

In some implementations, the BPR architecture 204 shown in FIG. 2 refers to a 1-CPP-wide ROM bitcell with backside VSS by way of BM0. The BPR architecture 204 may have a 2×1 ROM bitcell dimensions: 1CPP (critical poly pitch) width×1SC (standard cell) height. The BPR architecture 204 may have multiple programming layers, such as, e.g., dual programming layers: VT and TCN. Also, the BPR architecture 204 may have backside (BM0 VSS) tracks along with wide M0 BL tracks. Moreover, in some instances, the BPR architecture 204 may have frontside wordline bridges (M0: WL1, WL2, WL3, WL4) with sub-minimal length. Also, the BPR architecture 204 may have N-type diffusion regions (Ndiff) that may be formed and disposed adjacent (and/or below) to the frontside bitlines (M0: BL1, BL2).

As shown in FIG. 3, the BPR architecture 304 may have backside metal layer (BM0) coupled to ground (VSS or GND), and the BPR architecture 304 may have frontside metal layer (M0) coupled to multiple bitlines (BL1, BL2) and also multiple wordlines (WL1, WL2, WL3, WL4). Also, the BPR architecture 304 may have extended poly-gate lines (EPG) coupled to the wordlines (WL1, WL2, WL3, WL4). Also, the BPR architecture 304 may have one or more programming layers, such as, e.g., CNT layer and VT layer. In various instances, the CNT layer may be programmed so as to be coupled to ground (BM0 VSS) with interlayer vias (IV) and a first bitline (M0 BL1) or a second bitline (M0 BL2) by way of the VT layer, wherein the VT layer may be programmed so as to be coupled to the first bitline (M0 BL1) or the second bitline (M0 BL2). Therefore, the ROM based transistors may be programmed to a logical 1 or a logical 0 depending on the programmed state of the CNT layer and the VT layer.

In some implementations, the BPR architecture 304 shown in FIG. 3 refers to a 1-CPP-wide ROM bitcell with backside VSS by way of BM0. The BPR architecture 304 may have a 2×1 ROM bitcell dimensions: 1CPP (critical poly pitch) width×1SC (standard cell) height. The BPR architecture 304 may have multiple programming layers, such as, e.g., dual programming layers: VT and TCN. Also, the BPR architecture 304 may have backside (BM0 VSS) tracks along with wide M0 BL tracks. Moreover, in some instances, the BPR architecture 304 may have frontside wordline bridges (M0: WL1, WL2, WL3, WL4) when poly-over-BIV (buried inter-layer via) is allowed. Also, the BPR architecture 304 may have N-type diffusion regions (Ndiff) that may be formed and disposed adjacent (and/or below) to the frontside bitlines (M0: BL1, BL2).

As shown in FIG. 4, the BPR architecture 404 may have backside metal layer (BM0) coupled to ground (VSS or GND), and the BPR architecture 404 may have frontside metal layer (M0) coupled to multiple narrow bitlines (BL1, BL2) and multiple wordlines (WL1, WL2, WL3, WL4). The BPR architecture 404 may have poly-gate lines (PG) along with programmable CNT layers coupled to the wordlines (WL1, WL2, WL3, WL4). The BPR architecture 404 may have one or more programming layers, such as, e.g., the CNT layer and VT layer. In some instances, the CNT layer may be programmed so as to be coupled to ground (BM0 VSS) and a first narrow bitline (M0 BL1) or a second narrow bitline (M0 BL2) by way of the VT layer, and the VT layer may be programmed so as to be coupled to the first narrow bitline (M0 BL1) or the second narrow bitline (M0 BL2). The ROM based transistors may be programmed to a logical 1 or a logical 0 depending on the programmed state of the CNT layer and the VT layer.

In some implementations, the BPR architecture 404 shown in FIG. 4 refers to a 1-CPP-wide ROM bitcell with backside VSS by way of BM0. The BPR architecture 404 may have a 2×1 ROM bitcell dimensions: 1CPP (critical poly pitch) width×1SC (standard cell) height. The BPR architecture 404 may have multiple programming layers, such as, e.g., dual programming layers: VT and TCN. Also, the BPR architecture 404 may have backside (BM0 VSS) tracks along with narrow M0 BL tracks. Further, in some instances, the BPR architecture 404 may have frontside wordline bridges (M0: WL1, WL2, WL3, WL4) staggered over multiple rows (e.g., 2 rows). Also, the BPR architecture 404 may have N-type diffusion regions (Ndiff) that may be formed and disposed adjacent (and/or below) to the frontside bitlines (M0: BL1, BL2).

As shown in the top-half/bottom-half diagrams 500A-500B of FIGS. 5A-5B, the BPR architecture 504A-504B may have backside metal layer (BM0) coupled to ground (VSS or GND), and the BPR architecture 504 may have frontside metal layer (M0) coupled to multiple bitlines (BL1, BL2) and multiple wordlines (WL1, WL2, WL3, WL4). The BPR architecture 504 may have poly-gate lines (PG) and also programmable CNT layers coupled to the wordlines (WL1, WL2, WL3, WL4). The BPR architecture 504 may only use one of the programming layers, such as, e.g., the VT layer. In some instances, the VT layer may be programmed so as to be coupled to ground (BM0 VSS) and a first bitline (M0 BL1) or a second bitline (M0 BL2) by way of the VT layer. Further, in some instances, the ROM based transistors may be programmed to a logical 1 or a logical 0, e.g., depending on the programmed state of the VT layer.

In some implementations, the BPR architecture 504A-504B shown in FIGS. 5A-5B refers to a 1.5-CPP-wide ROM bitcell with backside VSS by way of BM0. The BPR architecture 504 may have a 2×1 ROM bitcell dimensions: 1.5CPP (critical poly pitch) width×1SC (standard cell) height. The BPR architecture 504 may only use a single programming layer, such as, e.g., single programming layer: VT. The BPR architecture 504 may have backside (BM0 VSS) tracks along with wide M0 BL tracks. Also, in some instances, the BPR architecture 504 may have frontside wordline bridges (M0: WL1, WL2, WL3, WL4) staggered over multiple rows (e.g., 2 rows). Also, the BPR architecture 504A-504B may have N-type diffusion regions (Ndiff) that may be formed and disposed adjacent (and/or below) to the frontside bitlines (M0: BL1, BL2).

In various implementations, as shown and described herein above in reference to FIGS. 2-4 and 5A-5B, the BPR architecture may refer to various cell architectures having a read-only bitcell with a transistor coupled between a bitline and ground (VSS or GND). Also, the BPR architecture may have one or more buried power rails coupled to ground (VSS or GND), wherein the read-only bitcell may be coupled to ground (VSS or GND) by way of the buried power rail. The read-only bitcell may include a transistor coupled between the bitline and the buried power rail, a gate of the transistor may be coupled to a wordline, and also, the transistor may refer to an N-type field effect transistor (NFET). In various instances, as shown and described in FIGS. 2-4, the read-only bitcell may have physical dimensions associated with a width of one critical poly pitch (1 CPP) and a height of one standard (STD) cell row, and the read-only bitcell is configured with multiple programming layers including dual programming layers. Otherwise, in various instances, as shown and described in reference to FIGS. 5A-5B, the read-only bitcell may have physical dimensions associated with a width of one and a half critical poly pitch (1.5 CPP) and a height of one standard (STD) cell row, and the read-only bitcell is configured with a single programming layer.

Figure 6:
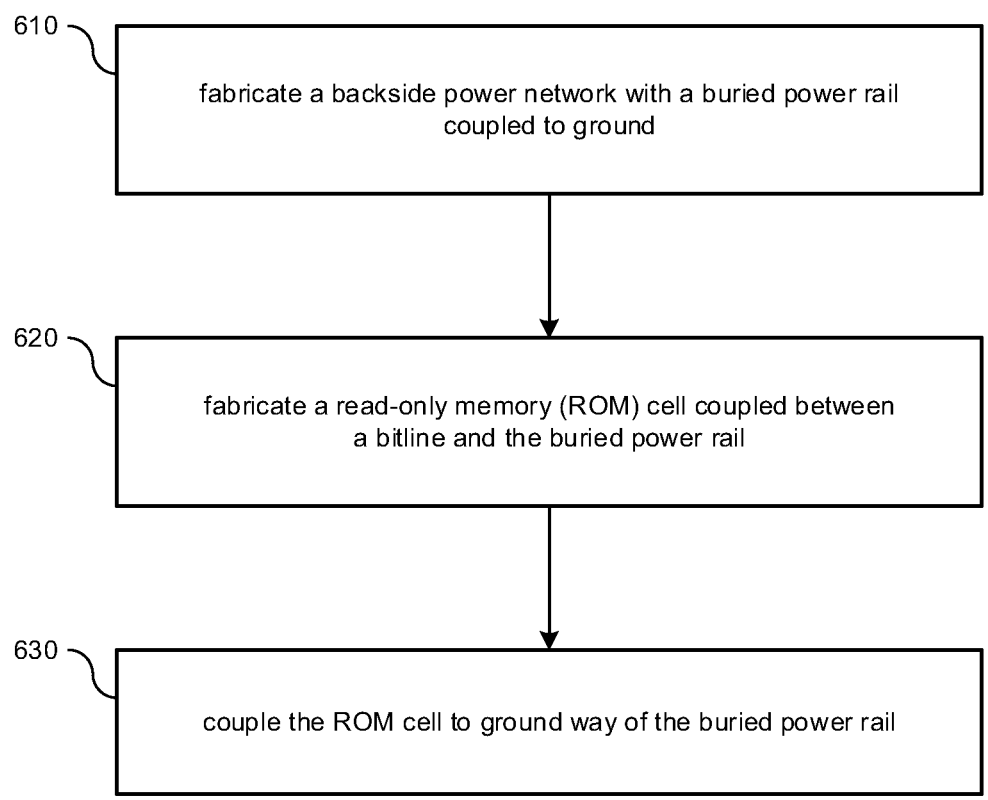
FIG. 6 illustrates a diagram of a method for fabricating bitcell architecture with a buried power rail in accordance with various implementations described herein.

FIG. 6 illustrates a diagram of a method 600 for fabricating bitcell architecture with a buried ground rail in accordance with implementations described herein.

It should be understood that even though the method 600 indicates a particular order of operation execution, in some cases, various particular portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in reference to FIGS. 1A-5B. Also, if implemented in software, method 600 may be implemented as a program and/or software instruction process configured for providing bitcell architecture schemes and techniques, as described herein. Further, if implemented in software, various instructions associated with implementing method 600 may be stored in memory and/or a database. For instance, various types of computing devices having a processor and memory may be configured to perform method 600.

In various implementations, method 600 may refer to a method of designing, providing, building, fabricating and/or manufacturing various non-volatile memory (NVM) bitcells as an integrated device that may involve use of various components and materials described herein. The non-volatile memory (NVM) bitcells may be integrated with various computing circuitry and related components on a single chip, and the non-volatile memory bitcells may be implemented in various embedded systems for various electronic, mobile and/or Internet-of-things (IoT) applications, including remote sensor nodes.

At block 610, method 600 may fabricate a backside power network with a buried power rail coupled to ground (VSS or GND). At block 620, method 600 may fabricate a read-only memory (ROM) cell (or ROM bitcell) that is coupled between a bitline and the buried power rail. In some implementations, the ROM cell may include a transistor that is coupled between the bitline and the buried power rail, and also, a gate of the transistor is coupled to a wordline. Also, the transistor may refer to an N-type transistor, such as, e.g., an N-type field-effect transistor (NFET). At block 630, method 600 may couple the ROM cell to ground (VSS or GND) by way of the buried power rail.

In some implementations, the ROM cell (or ROM bitcell) may include physical dimensions associated with a width of one critical poly pitch (1 CPP) and a height of one standard (STD) cell row, and the ROM cell may have multiple programming layers, such as, e.g., dual programming layers. In some other implementations, the ROM cell (or ROM bitcell) may have physical dimensions associated with a width of one and a half critical poly pitch (1.5 CPP) and a height of one standard (STD) cell row, and the ROM cell may have a single programming layer.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having a backside power network with a buried power rail that is coupled to ground. The device may include a read-only memory (ROM) cell coupled between a bitline and the buried power rail, and also, the ROM cell may be coupled to ground by way of the buried power rail.

Described herein are various implementations of a cell architecture with a read-only bitcell having a transistor coupled between a bitline and ground. The cell architecture may have a buried power rail coupled to ground, and the read-only bitcell may be coupled to ground by way of the buried power rail.

Described herein are various implementations of a method. The method may fabricate a backside power network with a buried power rail coupled to ground. The method may fabricate a read-only memory (ROM) cell coupled between a bitline and the buried power rail. The method may couple the ROM cell to ground by way of the buried power rail.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device, comprising:
   a backside power network having a buried power rail coupled to ground; and
   a read-only memory (ROM) cell coupled between a bitline and the buried power rail, wherein the ROM cell is coupled to ground by way of the buried power rail.

2. The device of claim 1, wherein the ROM cell includes a transistor coupled between the bitline and the buried power rail.

3. The device of claim 2, wherein the transistor comprises an N-type field-effect transistor (NFET).

4. The device of claim 2, wherein a gate of the transistor is coupled to a wordline.

5. The device of claim 1, wherein the ROM cell has physical dimensions associated with a width of one critical poly pitch (1 CPP) and a height of one standard (STD) cell row.

6. The device of claim 1, wherein the ROM cell has physical dimensions associated with a width of one and a half critical poly pitch (1.5 CPP) and a height of one standard (STD) cell row.

7. The device of claim 1, wherein the ROM cell is configured with multiple programming layers including dual programming layers.

8. The device of claim 1, wherein the ROM cell is configured with a single programming layer.

9. The device of claim 1, further comprising:
   a frontside power network having non-buried power rails, wherein the bitline is formed with at least one non-buried power rail of the non-buried power rails having a wide bitline track.

10. The device of claim 1, further comprising:
    a frontside power network having non-buried power rails, wherein the bitline is formed with at least one non-buried power rail of the non-buried power rails having a narrow bitline track.

11. A cell architecture, comprising:
    a read-only bitcell having a transistor coupled between a bitline and ground; and
    a buried power rail coupled to ground,
    wherein the read-only bitcell is coupled to ground by way of the buried power rail.

12. The cell architecture of claim 11, wherein the read-only bitcell includes a transistor coupled between the bitline and the buried power rail, and wherein a gate of the transistor is coupled to a wordline.

13. The cell architecture of claim 12, wherein the transistor refers to an N-type field-effect transistor (NFET).

14. The cell architecture of claim 11, wherein the read-only bitcell has physical dimensions associated with a width of one critical poly pitch (1 CPP) and a height of one standard (STD) cell row, and wherein the read-only bitcell is configured with multiple programming layers including dual programming layers.

15. The cell architecture of claim 11, wherein the read-only bitcell has physical dimensions associated with a width of one and a half critical poly pitch (1.5 CPP) and a height of one standard (STD) cell row, and wherein the read-only bitcell is configured with a single programming layer.

16. A method, comprising:
    fabricating a backside power network with a buried power rail coupled to ground;
    fabricating a read-only memory (ROM) cell coupled between a bitline and the buried power rail; and
    coupling the ROM cell to ground by way of the buried power rail.

17. The method of claim 16, wherein the ROM cell has a transistor coupled between the bitline and the buried power rail, and wherein a gate of the transistor is coupled to a wordline.

18. The method of claim 17, wherein the transistor refers to an N-type field-effect transistor (NFET).

19. The method of claim 16, wherein the ROM cell has physical dimensions associated with a width of one critical poly pitch (1 CPP) and a height of one standard (STD) cell row, and wherein the ROM cell has dual programming layers.

20. The method of claim 16, wherein the ROM cell has physical dimensions associated with a width of one and a half critical poly pitch (1.5 CPP) and a height of one standard (STD) cell row, and wherein the ROM cell has a single programming layer.

* * * * *